United States Patent
De Caria

(10) Patent No.: US 10,173,412 B2
(45) Date of Patent: Jan. 8, 2019

(54) APPARATUS AND METHOD FOR THE PHOTO-POLYMERIZATION OF FLEXOGRAPHIC PRINTING SHEETS

(71) Applicant: Sasu Vianord Engineering, Carros (FR)

(72) Inventor: Riccardo De Caria, Basiglio (IT)

(73) Assignee: Sasu Vianord Engineering, Carros (FR)

(*) Notice: Subject to any disclaimer, the term of this patent is extended or adjusted under 35 U.S.C. 154(b) by 47 days.

(21) Appl. No.: 15/159,552

(22) Filed: May 19, 2016

(65) Prior Publication Data

US 2016/0368260 A1    Dec. 22, 2016

(30) Foreign Application Priority Data

May 20, 2015  (IT) .................. 102015000016153

(51) Int. Cl.
| | |
|---|---|
| *B41C 1/00* | (2006.01) |
| *B41N 1/06* | (2006.01) |
| *G03F 7/20* | (2006.01) |
| *B41C 1/10* | (2006.01) |

(52) U.S. Cl.
CPC .................. *B41C 1/10* (2013.01); *B41N 1/06* (2013.01); *G03F 7/2004* (2013.01); *G03F 7/2022* (2013.01); *G03F 7/2032* (2013.01)

(58) Field of Classification Search
None
See application file for complete search history.

(56) References Cited

U.S. PATENT DOCUMENTS

| | | | |
|---|---|---|---|
| 5,073,792 A * | 12/1991 | Paccagnella | G03B 27/10 355/103 |
| 5,719,009 A | 2/1998 | Fan | |
| 6,262,825 B1 | 7/2001 | Mueller et al. | |
| 2001/0053498 A1 | 12/2001 | Fujimoto et al. | |
| 2002/0058196 A1 | 5/2002 | Kanga | |
| 2004/0038147 A1 | 2/2004 | Ray | |
| 2005/0227182 A1 | 10/2005 | Ali et al. | |
| 2009/0000735 A1 | 1/2009 | Zwadlo et al. | |
| 2011/0079158 A1 | 4/2011 | Recchia | |

(Continued)

FOREIGN PATENT DOCUMENTS

| | | |
|---|---|---|
| EP | 0399451 | 11/1990 |
| WO | WO2013122718 | 8/2013 |
| WO | WO2013156942 | 10/2013 |

*Primary Examiner* — Joshua D Zimmerman
(74) *Attorney, Agent, or Firm* — Stetina Brunda Garred & Brucker

(57) ABSTRACT

The invention relates to an autonomous apparatus for the photo-polymerization of a flexographic printing plate, which plate comprises a main face and a base opposite to said main face. The apparatus comprises an exposure chamber in which at least first photo-polymerization means of said base of said plate are installed. An input section and an output section are defined for letting said plate into/out from the exposure chamber, respectively. The apparatus further comprises moving means configured to drag said plate along a feeding direction. According to the invention, the first photo-polymerization means comprise a row of LEDs aligned according to a direction substantially orthogonal to said feeding direction.

14 Claims, 5 Drawing Sheets

(56) References Cited

U.S. PATENT DOCUMENTS

2013/0209939 A1\* 8/2013 Recchia .................. G03F 7/092
  430/296
2015/0114245 A1\* 4/2015 De Caria .............. G03F 7/2004
  101/425

\* cited by examiner

APPARATUS AND METHOD FOR THE PHOTO-POLYMERIZATION OF FLEXOGRAPHIC PRINTING SHEETS

FIELD OF THE INVENTION

The present invention relates to the domain of processes for manufacturing flexographic digital printing plates. In particular, the present invention relates to an apparatus and method for the photo-polymerization of flexographic digital printing plates.

BACKGROUND ART

Flexography is a direct rotary printing method which employs embossed plates made of photo-polymeric materials. The plates are flexible and soft, hence the name flexography. Such plates are inked and the print is obtained by means of direct deposition of the ink on the medium to be printed by virtue of a slight pressure exerted by a printing cylinder on which the plates are positioned.

Flexography is a high-speed printing process, capable of printing on many types of absorbing and non-absorbing materials. Some typical applications of flexographic printing are the production of paper and plastic bags, milk cartons, disposable cups and the like, but by virtue of the progress in printing quality, flexography is today also used for printing newspapers, for example, as well as packets and labels and for printing on plastic, films and acetate sheets, wrapping paper and on many other materials used for product packaging.

As known, the pre-printing step, i.e. the step of preparing the flexographic plate, which undergoes various steps, one of which is the step of exposing the plate to ultraviolet light (UV) to photo-polymerize it, is very important and delicate.

In order to obtain the required embossed characters, the plate is polymerized only at the points of a mask left permeable to light. In the case of the so-called analog printing plates, a negative film is applied onto the plate which shows the image to be printed in negative, while in the case of the so-called digital printing plates, the plates are covered with a layer which is abraded by means of laser engraving to create the negative of the image to be printed.

Exposing the plate to the light causes the polymerization only of the parts of the plate at the points permeable to light of the negative film, in the case of analog printing plates or of the points in which the layer of coating material was removed in the case of digital printing plates, thus forming the relief image to the printed on the polymer.

In all cases, the plate must be exposed to ultraviolet light (UV) for the necessary formation of the base (back exposure, i.e. of the bottom or back of the plate). In the apparatuses of the type known in the prior art, the steps of main exposure, i.e. exposing the main face of the plate, and of back exposure are generally performed in the scope of a continuous treatment process of the printing plate. After the exposure step, the flexographic plate undergoes other processing steps, including the washing step, by means of which the non-polymerized material is removed from the plate.

It has been seen that the integration in the exposure of the plate, above all with respect to the back exposure, in a continuous treatment process of a plate, determines a considerable complication in terms of design and control. At the same time, it has been seen that the inspection, maintenance and replacement operations of the means used for photo-polymerization are particularly complicated in a continuous process.

Thus, it is a main task of the present invention to provide an apparatus and method for the photo-polymerization of flexographic digital printing plates which allows to overcome the drawbacks mentioned above. In the scope of this task, it is a first object of the present invention to provide a compact, autonomous apparatus capable of autonomously carrying out at least the photo-polymerization of the secondary back face. In the scope of this task, it is another object of the present invention to provide an apparatus capable of autonomously carrying out the photo-polymerization of the main face and of the secondary back face. It is a further object of the present invention to provide an apparatus which is reliable and easy to be manufactured at competitive costs.

SUMMARY

The present invention relates to an apparatus for the photo-polymerization of a flexographic printing plate comprising a main face and a base opposite to said main face. The apparatus is characterized in that it comprises an exposure chamber provided with at least first photo-polymerization means of the base of the plate. Such an apparatus further comprises an input section and an output section for letting the sheet into/out from said exposure chamber, respectively. The apparatus further comprises moving means configured to drag said plate along a feeding direction. According to the invention, said first photo-polymerization means comprise a row of LEDs aligned according to a direction substantially orthogonal to the feeding direction. The device according to the invention is further provided with second photo-polymerization means of the main face of the flexographic printing plate. Such second photo-polymerization means comprise a row of LEDs aligned according to a direction substantially orthogonal to the feeding direction.

The apparatus according to the invention advantageously allows to carry out the concurrent photo-polymerization of the base and of the main face of the plate. Such an apparatus may be advantageously entirely autonomous, i.e. entirely disconnected from the other treatment operations which are normally performed on flexographic plates.

LIST OF FIGURES

Further features and advantages of the present invention will become more apparent from the following detailed description provided by way of non-limiting example and shown in the accompanying drawings, in which.

The same parts and the same corresponding components are indicated in the figures with the same reference numbers.

DETAILED DESCRIPTION

Figure 1:
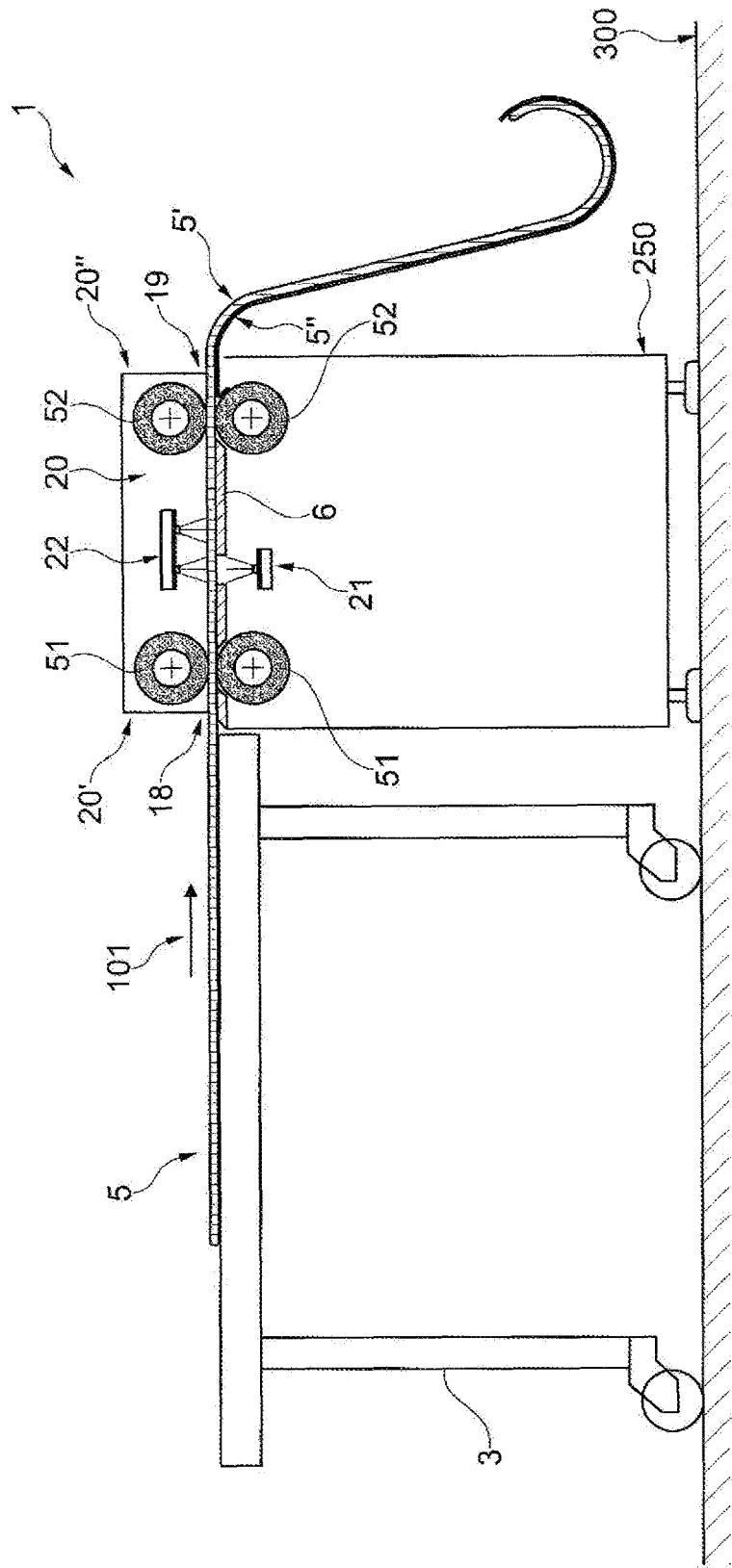
FIG. 1 is a diagrammatic overview of a first embodiment of an apparatus according to the present invention.

The apparatus according to the invention is indicated as a whole by reference numeral 1 in the mentioned figures. Apparatus 1 can be used for the photo-polymerization of a flexographic printing plate 6. Said plate 5 comprises a main face 5Y and a base 5" opposite to the main face 5. The apparatus 1 according to the invention is configured to carry out preferably autonomously, at least the photo-polymerization of the base 5" of plate 5.

The apparatus 1 according to the invention comprises at least one exposure chamber 20 comprising at least first photo-polymerization means 21 configured to carry out the photo-polymerization of said base 5". Hereinafter, the operation of photo-polymerization of base 5" will also be indicated by the term "BACK exposure". Apparatus 1 further comprises an input section 18 and an output section 19 for letting said plate 5 into/out from said exposure chamber 20, respectively.

Apparatus 1 comprises moving means of plate 5 which interact therewith. More precisely, the moving means define a feeding direction 101 for plate 5 in the exposure chamber 20. According to a first possible embodiment, the input section 18 and the output section 19 are defined on the opposite sides 20', 20" of the exposure chamber 20. In this configuration, the feeding direction 101 preferably comprises a single rectilinear feeding stretch between the input section 18 and the output section 19.

According to an alternative embodiment (not shown), the input section 18 and the output section 19 are defined on the same side of the exposure chamber 20. According to this alternative embodiment, the moving means of plate 5 define a movement path inside the exposure chamber which comprises a first stretch and a second stretch. The first stretch develops between the input section towards a first side 20" of the chamber 20 opposite to the first side 20' up to a predetermined position. The second stretch develops from said predetermined position towards the first side 20' of the chamber 20, i.e. towards the output section 19. In this alternative embodiment, the moving means of plate 5 will be configured to pass plate 5 from the first stretch to the second stretch at said predetermined position. In practice, the moving means reverse the feeding direction of plate 5.

As will be described in greater detail below, the moving means of plate 5 are electrically connected to a control unit 90 which determines the operation thereof.

In this regard, first sensor means 201 connected to the control unit 90 are arranged at the input section 18. Second sensor means 202 are preferably provided at the output section 19. Such second sensor means 202 are also connected to the control unit 90. The latter activates and deactivates the moving means as a function of corresponding signals received from said sensor means 201, 202.

Apparatus 1 further comprises a flat structure 6 which defines a preferably horizontal resting plane 105 (in FIG. 2) for the base 5" of plate 5. In this regard, said base 5" may rest either directly or indirectly on such a plane 105. Indeed, the sheet 5 may be mounted on a support layer 5"' made of transparent material. In this condition, the support layer of the plate, and not the base 5", rests directly on the resting plane 105.

The sliding base 6 comprises a transparent portion 66, preferably made of crystal, to allow the transmission of the light radiation emitted by the first photo-polymerization means 21. A second portion 66' of the sliding base 66 may be made of metal material instead, e.g. aluminum. Apparatus 1 preferably comprises cooling means of the second portion 66' of the flat structure 6.

The first means 21 are preferably operatively connected in place under the flat structure 6 and more precisely in place underneath the transparent position 66 of the flat structure 6. In this case, plate 5 is introduced in the exposure chamber 20 through the input section 18 so that base 5" faces downwards, i.e. towards floor 300 on which the structure 250 of apparatus 1 which supports the exposure chamber 20 rests. The input section 18 and output section 19 are advantageously configured so as to allow the treatment of plates with different widths L, evaluated along a direction orthogonal to that of feeding 101 (see FIGS. 6 to 8).

As shown in FIG. 1, the sheet 5 may be approached to the input section 18 by means of a carriage 3 or functionally equivalent means. At the output of the exposure chamber, plate 5 may be wound by effect of its flexibility and transported for a subsequent treatment. Apparatus 1 may thus be entirely independent from the line process.

Figure 2:
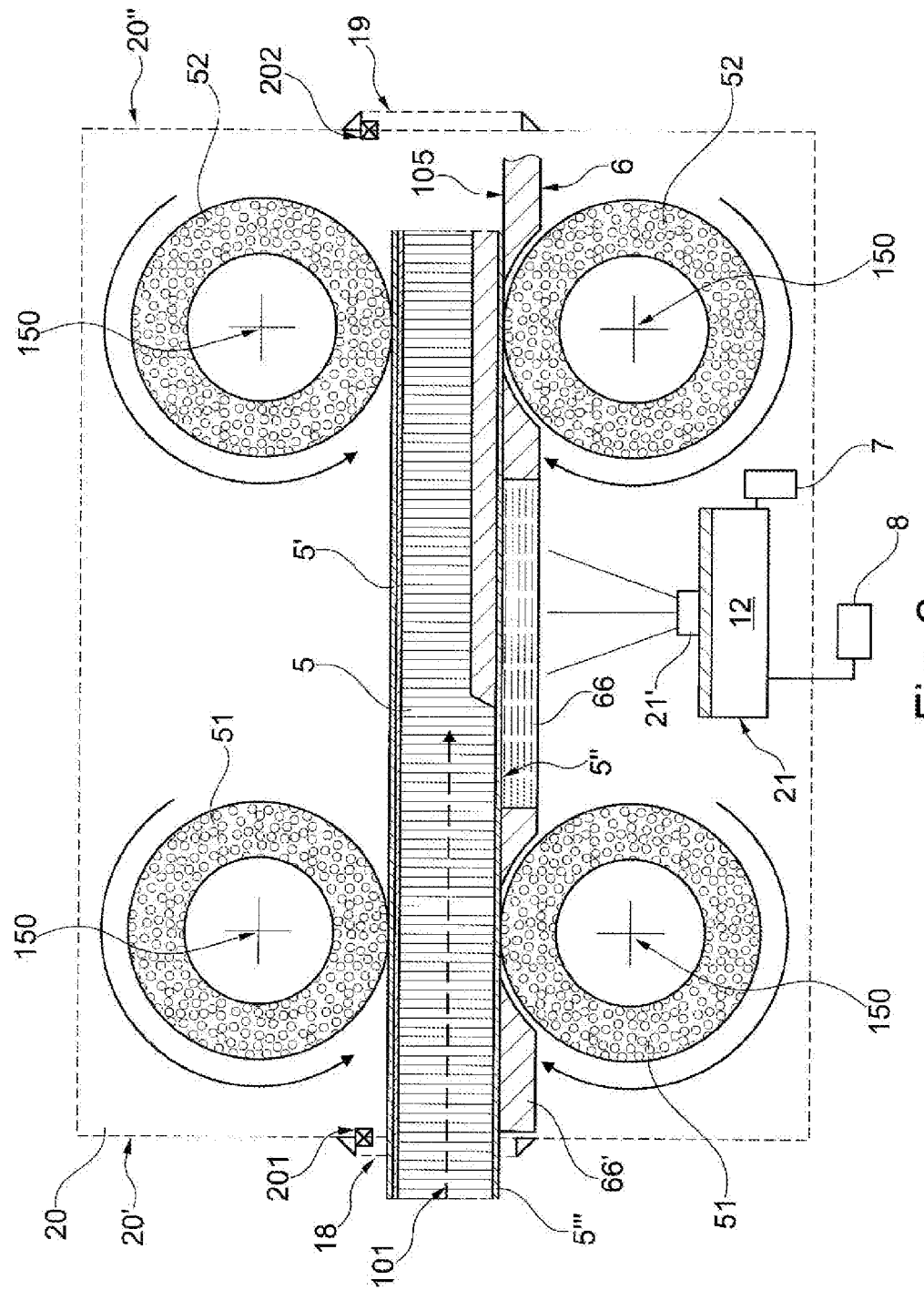
FIG. 2 is a detail view of the exposure change of the apparatus in FIG. 1.
Figure 3:
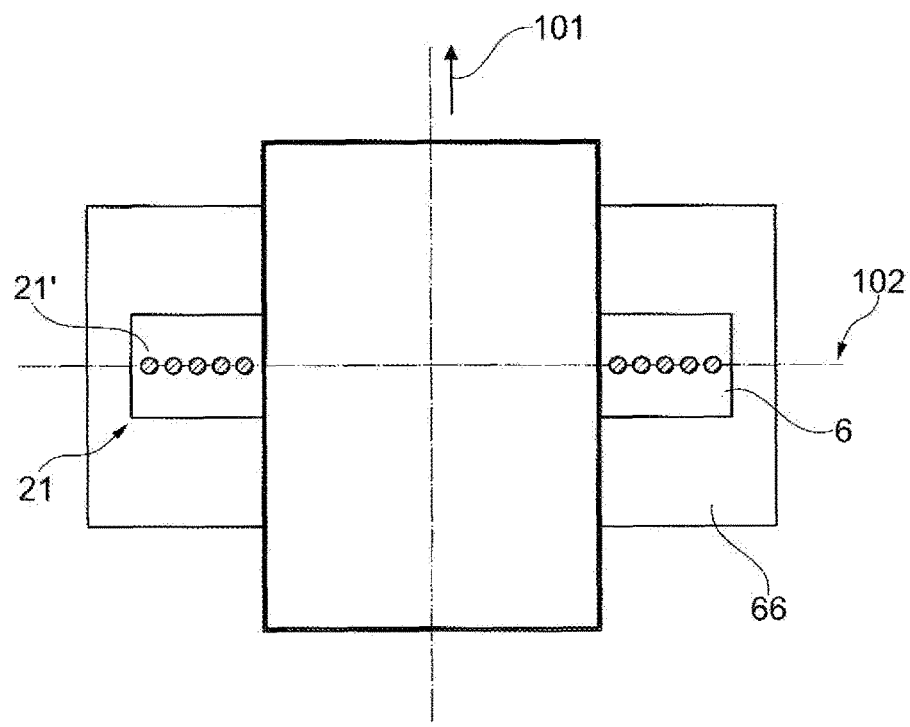
FIG. 3 is a diagrammatic view of the components of the apparatus in FIG. 1.

With reference to FIGS. 2 and 3, according to the invention, the first photo-polymerization means 21 comprise at least one row of LED elements 21' aligned according to a transversal direction 102 substantially orthogonal to the feeding direction 101. Said first means 21 further comprise first brightness adjustment means 7 of the brightness of said LEDs. Said first means 21 preferably also comprise a first support module 12 of said LEDs.

Figure 4:
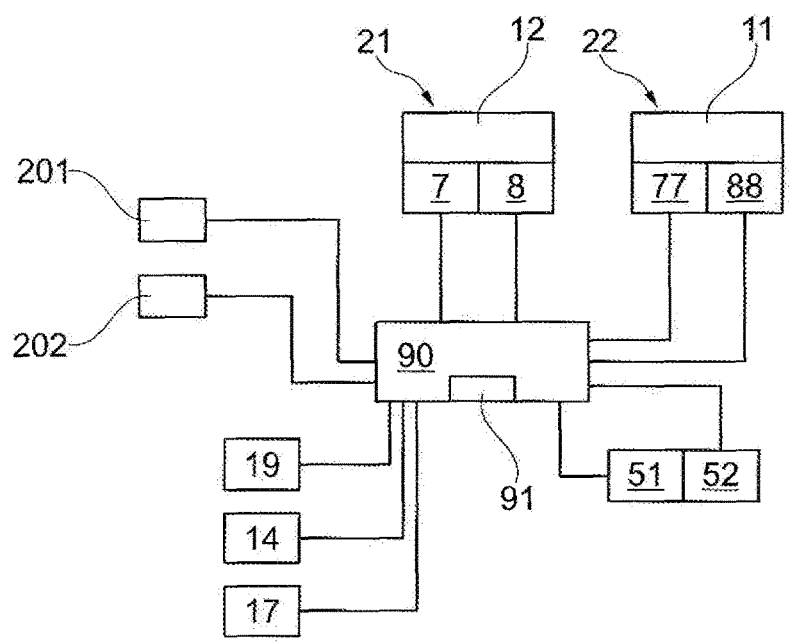
FIG. 4 is a block chart related to the control of an apparatus according to the present invention.

According to a further aspect, the apparatus 1 according to the invention comprises first distance adjusting means 8 for adjusting the distance between said first photo-polymerization means 21 and the crystal portion 66 of the flat structure 6 on which plate 5 rests. In particular, such a distance may be varied as a function of the type and thickness of plate 5 which crosses the exposure chamber 20. The first distance adjusting means 8 may be manually actuated or electronically actuated. This indicates the possibility of connecting such means to the control unit 90 of the apparatus, as diagrammatically shown in FIG. 4.

Figure 5:
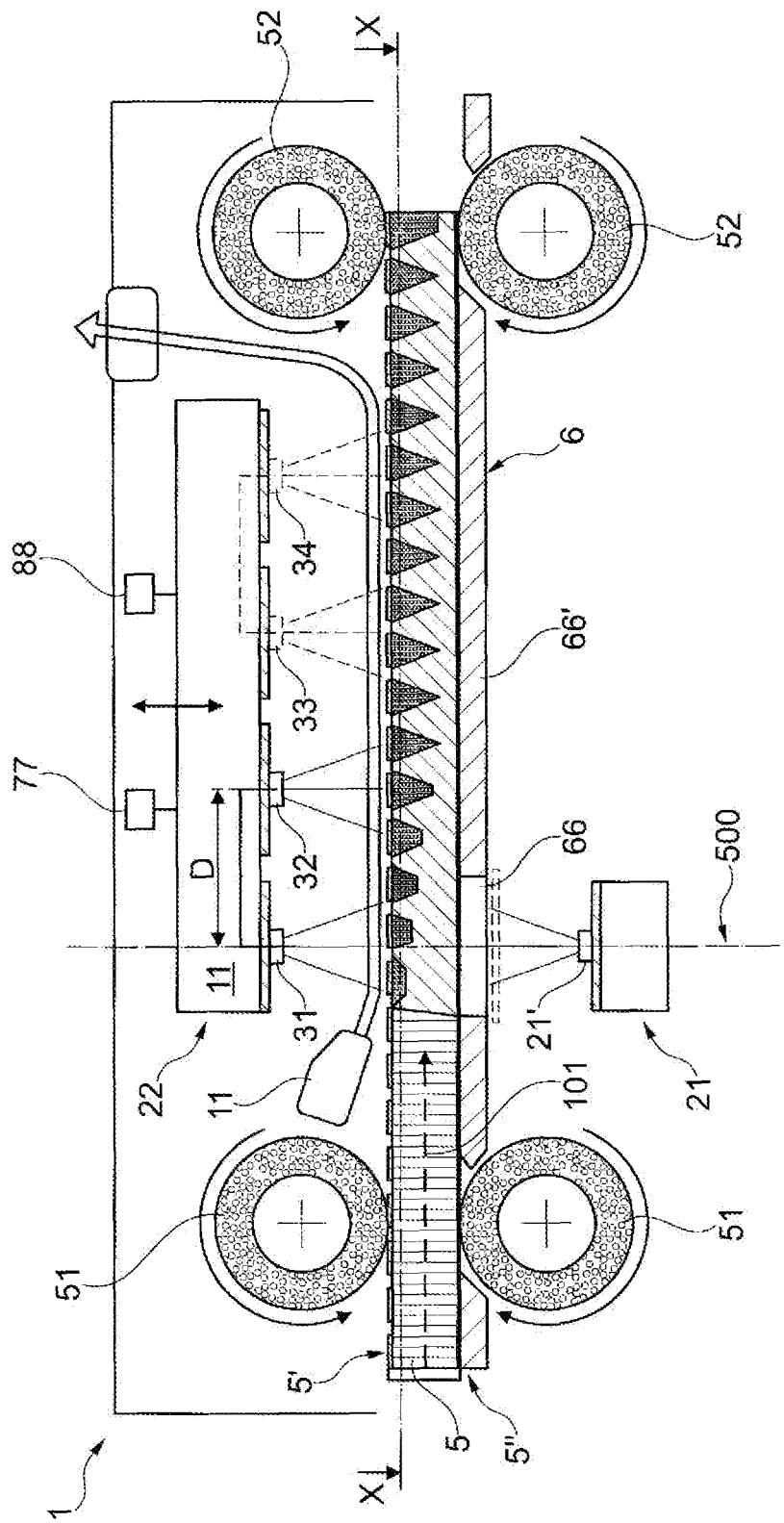
FIG. 5 is a diagrammatic view of a second embodiment of an apparatus according to the present invention.

With reference to FIG. 5, according to a further diagrammatic embodiment, apparatus 1 also comprises second photo-polymerization means 22 for the "MAIN exposure" of plate 5, this term indicating the photo-polymerization operation of the main face 5' of said plate 5. Such second means 22 are installed opposite to the first photo-polymerization means 21 with respect to the resting plane 105. In brief, the second means 22 are installed in a position above the resting plane 105, i.e. over plate 5 transiting in the exposure chamber 20.

The second photo-polymerization means 22 comprise at least one row of LEDs 31 aligned according to a direction which is substantially orthogonal to the feeding direction 101. The second means 22 preferably comprise a plurality of rows 31, 32, 33, 34 of LEDs parallel to one another and arranged at a predetermined distance D evaluated according to a direction parallel to that of feeding 101. Each row 31, 32, 33, 34 of LEDs is oriented so as to be orthogonal to the feeding direction 101. Said second photo-polymerization means 22 preferably comprise further brightness adjustment means 77 for adjusting the brightness of said LEDs. Such further brightness adjustment means 77 are also electrically connected and controlled by the control unit 90 of apparatus 1, as diagrammatically shown in FIG. 4. In this regard, the control unit 90 may intervene by adjusting the intensity of the LEDs of each row independently from the other rows.

The second photo-polymerization means 22 preferably comprise at least a second support module 11 adapted to support said rows of LEDs. Such a second module 11 may be configured to support one, some or even all said rows of LEDs. In the embodiment shown in FIG. 5, for example, there is provided a second module 11 which supports four rows 31, 32, 33, 34 of LEDs arranged in place above the resting plane 105. Such rows 31, 32, 33, 34 are equally distanced apart along a direction parallel to the feeding direction 101. It is worth noting that the number of rows of LEDs may vary according to the cases. For example, the rows of LEDs drawn with a dashed line in FIG. 5 and indicated with reference numerals 33 and 34, may either be installed or not according to the quality and depth required for the main exposure.

According to another aspect of the present invention, said at least one row of LEDs 211 of the first means 21 is coplanar to at least one row of LEDs 31 of the second means 22. More specifically, said a least one row of LEDs 31 of the first means 21 and said at least one row of LEDs define a reference plane 500 which is substantially orthogonal to the feeding direction 101 of the plate and/or the resting plane 105 (i.e. to the flat structure 6) of plate 5.

Preferably each LED of said first photo-polymerization means 21 is aligned with a corresponding LED of said second photo-polymerization means 22 along a direction which is coplanar to said reference plane 500 and orthogonal to said feeding plane 102. We have seen that this condition has a synergistic effect with respect to the profile definition of the parts of plate 5 which are polymerized. In other words, it has been that the alignment of the LEDs which carry out the back exposure with the corresponding LEDs which carry out the main exposure improves the definition of the part polymerized parts by means of the main exposure.

Again with reference to the mentioned FIG. 5, the apparatus preferably comprises air cooling means 14 configured to cool the main face 5' of the plate during the MAIN exposure. The second photo-polymerization means 22 preferably also comprise second distance adjusting means 88 for adjusting of the distance from the resting plane 105. Such means may be activated manually or controlled electrically, e.g. by means of the control unit 90, as diagrammatically shown in FIG. 4.

The apparatus according to the invention preferably comprises dimming means configured to prevent the reflection on the second photo-polymerization means 22 of the light generated by the first photo-polymerization means 21. More precisely, such dimming means have the function of preventing the light generated by the means used for the MAIN exposure from being diffused under plate 5 thus disturbing the diffusion of the light generated by the means used for the BACK exposure.

Figure 6:
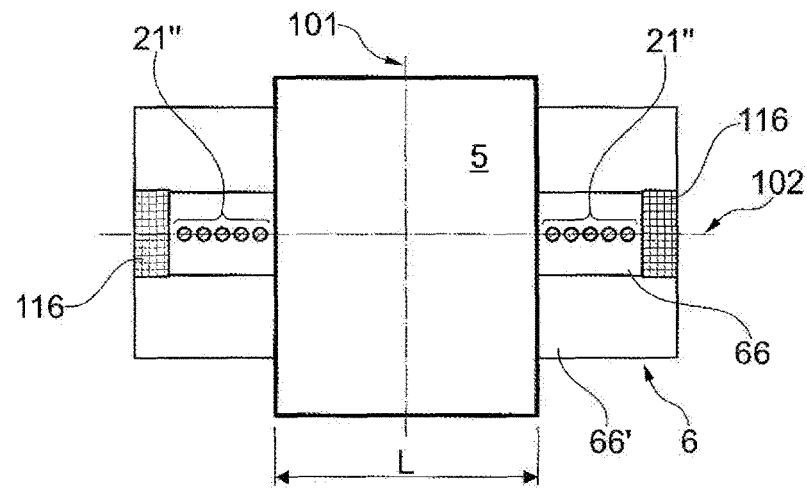
FIGS. 6 to 8 are diagrammatic views of the components of an apparatus according to the invention.
Figure 7:
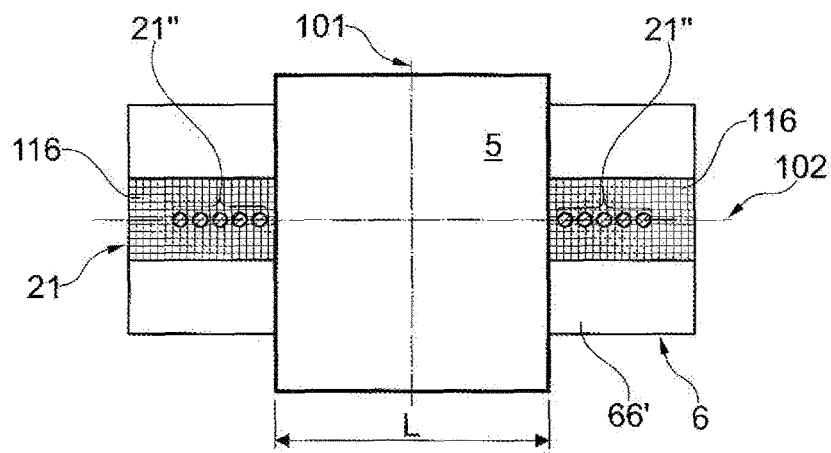
Figure 8:
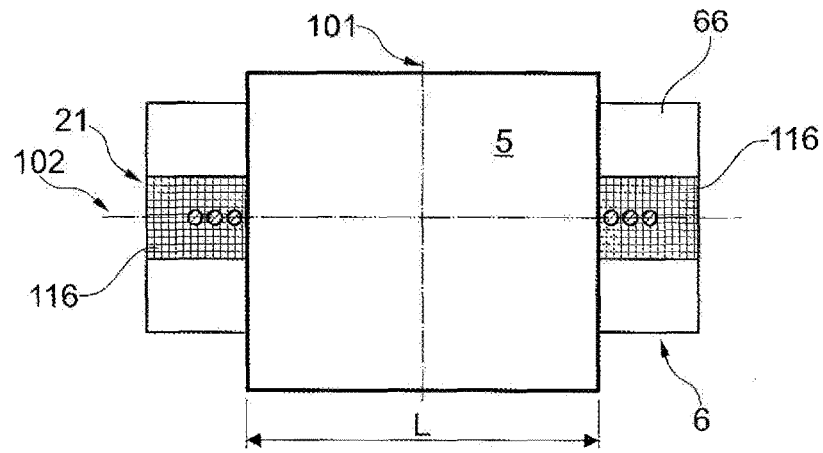

FIGS. 6 to 8 show a possible embodiment of such dimming means. Such FIG. 5 are substantially diagrammatic views taken along a section plane XX indicated in FIG. 1. In such figures, the resting plane 105 is shown with the portion of transparent material 66 and the first exposure means 21 provided to carry out the BACK exposure. The dimming means preferably comprise two curtain elements 116 arranged on opposite sides with respect to plate 5. Such curtain elements 116 are configured to cover/dim the LEDs (indicated by reference numeral 21") of the first means 21 which are not above plate 5 during the transit of the plate in the exposure chamber 20. In other words, according to the invention, the extension of the dimming means is adjustable as a function of the width L of the plate and along a transversal direction 102 substantially orthogonal to the feeding direction 101 of the plate itself.

In brief, the extension of the curtain elements 116 is adjustable and is determined as a function of the width L of plate 5, as can be inferred from the comparison between FIGS. 7 and 8. In FIG. 7, the curtain elements 116 have an L extension, measured along a direction orthogonal to the feeding direction, which is higher than that of the same elements in FIG. 8 in which the plate has a width greater than that of FIG. 7. The possibility of using other dimming means functionally equivalent to the curtain elements 116 described above and shown in the figures is naturally within the scope of the present invention.

According to another aspect of the present invention, the moving means of plate 5 in the exposure chamber 20 preferably comprise at least one pair of first dragging rollers 51 installed in a position proximal the input section 18 and a pair of second dragging rollers 52 installed in a position proximal to the output section 19. For each pair, the rollers 51,52 are installed in opposite position with respect to the resting plane 105 of plate 5 and such that their rotation axis 150 is substantially orthogonal to the feeding direction 101. The distance between two opposite rollers is set so as to generate a pressure on a plate sufficient to determine the dragging thereof. For each pair, the rollers are preferably externally coated with soft rubber. For each pair, at least one of said rollers 51,52 is connected to motor means controlled, in turn, by the control unit 90 as a function of the position of plate 5 in the exposure chamber 20 and thus as a function of the signals sent by the first sensor means 201 and of the second sensor means 202 indicated above. The rotation speed of the rollers 51, 52 is established as a function of the required features of the photo-polymerization process.

As mentioned in several passages of the description, the control unit 90 is thus provided to control nearly all the components of the apparatus 1 according to the invention. The control unit 90 is provided with user interface means 91 which allow an operator to intervene by modifying the operating parameters, which are for example: the distance and intensity of the polymerization means and/or the feeding speed of plate 5. As a function of such parameters and of the position of plate 5 in the exposure chamber 20, the control unit 90 will control, as a consequence, the first polymerization means 21, the second polymerization means 22, the moving means (rollers 51, 52), the cooling means 14 of plate 5, the cooling means 19 of the flat structure 6 and the cooling system 17 of the photo-polymerization means 21, 22.

From the above, it is apparent that the present invention also relates to a method for the photo-polymerization of a plate which concurrently allows to carry out the main exposure and the back exposure. The method according to the present invention includes providing an exposure chamber and dragging the plate into the chamber according to a feeding direction. The method according to the invention includes carrying out the photo-polymerization of the base (back exposure) of the plate in the exposure chamber by means of first photo-polymerization means comprising one row of LEDs which is arranged according to a direction orthogonal to said feeding direction. The method according to the invention includes carrying out the photo-polymerization of the main (main exposure) of the plate in the exposure chamber by means of second photo-polymerization means comprising one row of LEDs which is arranged/oriented according to a direction orthogonal to the feeding direction.

According to a first aspect, the method includes carrying out the main exposure by means of a plurality of rows of LEDs which are arranged so as to be parallel to one another and so that each is aligned/oriented according to a direction substantially orthogonal to said feeding direction.

According to another aspect, the method includes arranging a row of LEDs provided for the main exposure and a row of LEDs provided for the back exposure so that the two rows are coplanar on a reference plane orthogonal to the feeding direction of the plate in the exposure chamber. Each of the LEDs employed for the back exposure is preferably aligned with a corresponding LED used for the main exposure along a direction which is coplanar to the reference plane indicated above. As already indicated above, this arrangement advantageously allows to improve the definition of the photo-polymerized parts by means of the main exposure.

It is worth noting that the method according to the invention may be implemented in the scope of an autonomous apparatus as described above, but also in the scope of a more complex system in which other treatment operations are performed in addition to photo-polymerization.

The invention claimed is:

1. An apparatus for the photo-polymerization of a flexographic printing plate, said plate comprising a main face and a base opposite to said main face, wherein said apparatus comprises
    an exposure chamber comprising at least first photo-polymerization means of said base of said plate;
    an input section and an output section for letting said plate into/out from said exposure chamber, respectively;
    moving means configured to drag said plate along a feeding direction;
wherein said first photo-polymerization means comprise a row of LEDs aligned according to a direction orthogonal to said feeding direction, and wherein
said photo-exposure chamber comprises second photo-polymerization means of said main face of said plate, said second means comprising at least one row of LEDs aligned according to a transverse direction orthogonal to said feeding direction; and two curtain elements arranged on opposite sides with respect to the plate to prevent the reflection, on said second photo-polymerization means, of the light generated by said first photo-polymerization means.

2. An apparatus according to claim 1, wherein said apparatus comprises a flat structure on which said base rests either directly or indirectly, said flat structure comprising a transparent portion, said first photo-polymerization means being located in a position underneath said transparent portion.

3. An apparatus according to claim 1, wherein said moving means comprise at least one pair of first dragging rollers installed in a position proximal to said input section and one pair of second dragging rollers installed in a position proximal to said output section, wherein for each of said pairs, the rollers are installed in an opposite position with respect to a feeding plane of said plate and so that the rotation axes thereof are coplanar on a plane substantially orthogonal to said feeding direction.

4. An apparatus according to claim 2, wherein said apparatus comprises means for cooling said flat structure.

5. An apparatus according to claim 1, wherein said second means comprise a plurality of rows of LEDs aligned according to a transverse direction substantially orthogonal to said feeding direction.

6. An apparatus according to claim 1, wherein at least one row of LEDs of said second photo-polymerization means and at least said row of LEDs of said first photo-polymerization means are coplanar on a reference plane substantially orthogonal to the plate.

7. An apparatus according to claim 1, wherein each LED of said at least one row of LEDs of said second photo-polymerization means is aligned with a corresponding LED of said first means according to a direction coplanar to said reference plane.

8. An apparatus according to claim 1, wherein said apparatus comprises brightness adjusting means for adjusting the brightness of said LEDs of said first means and/or distance adjusting means for adjusting the distance of said LEDs of said first means from said base of said plate.

9. An apparatus according to claim 1, wherein said apparatus comprises brightness adjusting means for adjusting the light intensity of said LEDs of said second means and/or distance adjusting means for adjusting the distance of said LEDs of said second means from the main face of said plate.

10. A method for the photo-polymerization of a flexographic printing plate, wherein said plate comprises a main face and a base opposite to said main face, wherein said method comprises the steps of:
    preparing an exposure chamber;
    dragging said plate into said exposure chamber according to a feeding direction;
    carrying out, in said exposure chamber, the photo-polymerization of said base of said plate by means of first photo-polymerization means comprising a first row of LEDs aligned according to a direction orthogonal to said feeding direction;
    carrying out, in said exposure chamber, the photo-polymerization of said main face of said plate by means of second photo-polymerization means comprising at least one row of LEDs aligned according to a direction orthogonal to said feeding direction;
    wherein two curtain elements are arranged on opposite sides with respect to the plate to prevent the reflection, on said second photo-polymerization means, of the light generated by said first photo-polymerization means.

11. A method according to claim 10, wherein said method includes carrying out the photo-polymerization of said main face of said plate by means of a plurality of rows of LEDs by arranging such rows parallel to one other and so that each one is aligned in a direction substantially orthogonal to said feeding direction.

12. The method according to claim 10, wherein the first row of LEDs of said first photo-polymerization means and at least one said row of LEDs of said second photo-polymerization means are coplanar on a reference plane substantially vertical and orthogonal to the plate.

13. A method according to claim 11, wherein said method comprises the step of arranging said at least one row of LEDs of said second means and said at least one row of said first means so that the LEDs of the two rows are coplanar on a reference plane orthogonal to the feeding direction.

14. A method according to claim 10, wherein said method comprises the step of arranging said at least one row of LEDs of said second means and said at least one row of said first means so that each LED of said first row of LEDs of said second means is aligned with a corresponding LED of said row of LEDs of said first means according to a direction coplanar to said reference plane.

* * * * *